// United States Patent [15] 3,664,868
Davis et al. [45] May 23, 1972

[54] GOLD METALLIZING OF REFRACTORY METALS ON CERAMIC SUBSTRATES

[72] Inventors: M. Paul Davis, Hixson; Paul R. Theobald, Chattanooga, both of Tenn.

[73] Assignee: American Lava Corporation, Chattanooga, Tenn.

[22] Filed: Mar. 16, 1970

[21] Appl. No.: 20,112

[52] U.S. Cl. ............ 117/212, 117/227
[51] Int. Cl. ............ H05k 3/10
[58] Field of Search ............ 117/212, 160, 227; 252/514

[56] References Cited

UNITED STATES PATENTS 3,539,114 11/1970 Short ............ 252/514 X
3,529,350 9/1970 Rairden ............ 117/212

*Primary Examiner*—Ralph S. Kendall
*Attorney*—Kinney, Alexander, Sell, Steldt & Delahunt

[57] ABSTRACT

Substrates having patterns of refractory metals, such as tungsten, molybdenum or molybdenum-manganese, are clad with gold which is congruent to the refractory metal pattern by screen-printing a gold ink essentially free from other inorganic constituents over the refractory metal pattern and then firing to a temperature above the melting point of gold. Exactly congruent gold layers having a smooth fire-polished surface are thus obtained. The method is equally applicable to terminals which are readily accessible to barrel plating and to terminals which are inaccessible to normal barrel plating procedures.

5 Claims, No Drawings

GOLD METALLIZING OF REFRACTORY METALS ON CERAMIC SUBSTRATES

This invention relates to composite substrates having refractory metal circuitry, which may be partially buried within the refractory substrate, and possess gold cladding on exposed surfaces of the refractory metal. In particular this invention relates to heavily gold clad tungsten, molybdenum or molybdenum-manganese metallic patterns on alumina substrates.

In the production of composite substrates having refractory metal circuitry on alumina or other ceramic substrates it has been a common practice to apply gold plating to the exposed terminals to provide protection against oxidation and to enhance the ease of making contact to leads and components. Electro-plating of gold on the refractory metals, by which here is meant particularly tungsten, molybdenum and molybdenum-manganese, is somewhat difficult where there are numerous small isolated portions which cannot be contacted easily. For example, the terminals in a package for an integrated circuit can only be reached through contacts made with the outer portions of the circuit and a pad in such a device must be connected to an outer terminal at some point. This is necessary so that barrel plating techniques can be used. Under such circumstances thin deposits of gold of the order of one or two microns in thickness may be achieved but thicker deposits of the order of four to eight microns cannot be applied satisfactorily. It would be advantageous in many instances to have thicker deposits to facilitate attachment of devices by the silicon gold eutectic or so that more metal will be available for making contact. Heavy electroplating for surface deposition is only possible in idealized conditions which are not provided by these composite substrates.

It is an object of this invention to provide gold cladding on refractory metals such as tungsten, molybdenum and molybdenum-manganese used as metallic circuitry components of composite substrates. Other objects will become evident hereinafter.

In accordance with these and other objects of the invention it has been found that a very convenient method for depositing heavy gold layers on refractory metals is by printing using a fine gold printing ink. In the present instance, after having screen-printed the desired gold pattern, the composite substrate is fired at a temperature above the melting point of gold, about 1,063° C. Surprisingly under these conditions the gold melts and flows onto the terminal even when it was slightly out of registry initially, for example, overrunning the sides of the refractory metal pattern slightly. It is drawn together and is exactly congruent to the refractory metal surface which it is desired to coat. Furthermore the surface is very shiny as a result of the fire polishing. Gold clad layers may be from about four to ten microns in thickness and if desired additional layers may be applied and fired to give extra thickness. The gold when it is melted does not wet the ceramic surfaces at all. It is repelled by the ceramic and excellent pattern definition is therefore achieved.

Surprisingly, although the gold appears to wet the tungsten or other refractory metal surface readily, there appears to be no intermetallic compound formation between the tungsten and gold, nor does there appear to be any diffusion of gold into the tungsten layer. When the tungsten layer shows porosity of any sort the gold may penetrate it to the ceramic layer.

Gold clad tungsten or molybdenum conductors in substrates of the invention are found to be readily bonded to small diameter, i.e., 1 mil. (0.0254 mm.) gold wire using ultrasonic or thermo-compression bonding. The ease of the eutectic formation between the gold silicon chips, i.e., small integrated circuits, is also excellent.

Gold clad tungsten or molybdenum-manganese composite substrates of the invention are also vastly superior to those obtained using glass-fritted gold fired in air which has been used for screen-printing heretofore. Such glass-fritted golds contribute to high electrical resistivity and poor adhesion. Further, they lack chemical chemical stability under reducing conditions. This lack of stability is associated with the use of lead boro-silicate glasses which are reduced in the presence of carbon or hydrogen atmospheres. Such reducing atmospheres are commonly used in the processing of ceramic composite substrates, particularly those containing these refractory metals.

A further advantage of gold clad tungsten or molybdenum-manganese refractory metal patterns is that the gold is fully dense and can include no entrapped gases, salts or any organic materials which might be entrapped during electroplating operations. Such impurities in the gold layer are deleterious and can result in the instability or deterioriation of the item either on standing or in use. They may contribute to unreali-bility of components.

A suitable gold screening ink is a suspension of about 80 percent of fine gold at least 99 percent pure and preferably 99.9 percent pure and 20 percent of a vehicle such as a 4 percent solution of ethylcellulose in terpineol. Other vehicles may be used but the pigment is essentially pure gold.

This ink, sometimes referred to as a ceramic metallizing composition, provides highly adherent gold cladding to which numerous other metals can be attached. It is suitable for the attachment of thick film components such as conductors, resistors, dielectrics, etc. for chip components such as capacitors or semi-conductors, for active devices such as diodes, transistors etc. or integrated circuits. In particular pure gold is valuable for the attachment of silicon devices where alloys might cause contamination.

What is claimed is:

1. Process for the gold cladding of refractory metal patterns on ceramic substrates comprising the steps of A. applying ink having fine gold pigment of at least 99 percent purity in a pattern essentially congruent with and essentially in registry with a refractory metal pattern and, B. drying and thereafter firing the article at a temperature above the melting point of gold.

2. Process according to claim 1 wherein the ink contains about 80 percent by weight of finely divided gold of at least 99 percent purity.

3. Process according to claim 1 wherein the firing temperature is from about 1,063° to about 1,200° C.

4. A composite ceramic substrate having a pattern of refractory metal conductors and terminals and adhered thereto and exactly congruent therewith a fire-polished gold cladding from about four to about ten microns thick produced by the process of claim 1.

5. A composite ceramic substrate according to claim 4 wherein the refractory metal is tungsten or molybdenum-manganese.

* * * * *